United States Patent
Ye

(10) Patent No.: US 11,067,903 B2
(45) Date of Patent: Jul. 20, 2021

(54) METHOD FOR MEASURING CRITICAL DIMENSION OF PHOTORESIST PATTERN

(71) Applicant: SAMSUNG DISPLAY CO., LTD., Yongin-si (KR)

(72) Inventor: Sang Heon Ye, Cheonan-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

(21) Appl. No.: 16/839,384

(22) Filed: Apr. 3, 2020

(65) Prior Publication Data
US 2021/0041791 A1 Feb. 11, 2021

(30) Foreign Application Priority Data
Aug. 6, 2019 (KR) .......... 10-2019-0095400

(51) Int. Cl.
*G03F 7/20* (2006.01)
*G01N 21/88* (2006.01)
(Continued)

(52) U.S. Cl.
CPC .......... *G03F 7/70625* (2013.01); *G01B 11/02* (2013.01); *G01N 21/8851* (2013.01);
(Continued)

(58) Field of Classification Search
CPC ............. G03F 7/70608; G03F 7/70616; G03F 7/70625; G03F 7/70633; G03F 7/70641; G03F 7/7065; G03F 7/70666; G03F 7/70675; G09G 3/006; G01B 11/02; G01B 11/022; G01B 11/024; G01B 11/04; G01B 11/043; G01B 11/046; G01B 11/06; G01N 2021/9513; G01N 2021/95615; G01N 21/88; G01N 21/8803; G01N 21/8806; G01N 21/8861; G01N 21/9501; G01N 21/956; G01N 21/95607
See application file for complete search history.

(56) References Cited

U.S. PATENT DOCUMENTS 3,578,906 A * 5/1971 Holmstrom ............ G01B 11/14
348/126
4,500,202 A * 2/1985 Smyth .................. G01B 11/024
348/126
(Continued)

FOREIGN PATENT DOCUMENTS

KR 10-2008-0099298 11/2008
KR 10-2009-0091116 8/2009
(Continued)

*Primary Examiner* — Gordon J Stock, Jr.
(74) *Attorney, Agent, or Firm* — F. Chau & Associates, LLC

(57) ABSTRACT

Systems and methods for measuring a critical dimension of a photoresist are described. Measuring a critical dimension of a photoresist may include obtaining intensity data, setting a plurality of unit areas, extracting the intensity data, calculating corrected intensity data, and calculating critical dimension data. Obtaining the intensity data by scanning the target substrate may include setting a first scan area and a second scan area, obtaining first intensity data, and obtaining second intensity data, and comparing the first intensity data and the second intensity data.

22 Claims, 10 Drawing Sheets

(51) Int. Cl.
  *G01B 11/02* (2006.01)
  *G01N 21/956* (2006.01)
  *G01N 21/95* (2006.01)
  *G09G 3/00* (2006.01)

(52) U.S. Cl.
  CPC ....... *G01N 21/9501* (2013.01); *G01N 21/956* (2013.01); *G09G 3/006* (2013.01)

(56) References Cited

U.S. PATENT DOCUMENTS

| | | | | |
|---|---|---|---|---|
| 7,834,317 | B2* | 11/2010 | Nakagaki | H01J 37/265 |
| | | | | 250/310 |
| 8,160,350 | B2* | 4/2012 | Yishai | G06T 7/0004 |
| | | | | 382/145 |
| 9,217,717 | B2* | 12/2015 | Flock | G01N 21/9501 |
| 9,360,662 | B2* | 6/2016 | Koptyaev | G02B 21/365 |
| 9,390,494 | B2* | 7/2016 | Hess | G06T 7/001 |
| 9,778,205 | B2* | 10/2017 | Hess | G03F 1/84 |
| 2010/0309308 | A1* | 12/2010 | Saphier | G06T 7/33 |
| | | | | 348/92 |
| 2020/0150062 | A1* | 5/2020 | Song | G03F 1/86 |

FOREIGN PATENT DOCUMENTS

| | | |
|---|---|---|
| KR | 10-2010-0049799 | 5/2010 |
| KR | 10-2014-0145199 | 12/2014 |

* cited by examiner

METHOD FOR MEASURING CRITICAL DIMENSION OF PHOTORESIST PATTERN

CROSS-REFERENCE TO RELATED APPLICATIONS

This application claims priority from Korean Patent Application No. 10-2019-0095400 filed on Aug. 6, 2019 in the Korean Intellectual Property Office, and all the benefits accruing therefrom under 35 U.S.C. § 119, the disclosure of which is incorporated herein by reference in its entirety.

BACKGROUND

1. Field of the Disclosure

The present disclosure relates to measuring critical dimensions of a photoresist pattern.

2. Description of the Related Art

Electronic devices such as televisions, mobile devices, and computers use displays to visualize information for a user. Liquid crystal displays (LCD) and organic light-emitting displays (OLED) are examples of flat-panel displays used in electronic devices. Photoresist materials are an important element in the manufacturing of flat-panel displays.

A photoresist is a light-sensitive material used to form a patterned coating onto a surface. To manufacture a flat-panel display, a photoresist may be deposited on a substrate. Then, a mask with a specified pattern is placed on top of the photoresist to block light. The mask is manufactured according to design rules which define limits on the size of spaces between lines of the mask. Light is then applied to the mask, which allows a portion of the light to pass through to the photoresist. The photoresist then assumes the pattern of the light passing through the mask.

The spatial limitations of the design rules may be referred to as a critical dimension (CD). A CD is a minimum space between two lines, or a minimum line width, which is allowed for the manufacturing of the semiconductor elements Automatic optical inspection (AOI) may be used to measure a CD of a photoresist pattern. A light source that emits light at a target substrate and a sensor used to measure an intensity of light reflected by the target substrate may be used for the AOI. A lack of uniformity in the emitted light can lead to variations in received intensity data, influencing CD calculations. Incorrect CD calculations may influence electrical characteristics of a circuit. As a result, the quality of a display may be degraded. Therefore, there is a need in the art for improved reliability of the measurement results of the intensity data to determine accurate CD calculations.

SUMMARY

The present disclosure is directed to providing a measuring method capable of improving reliability of a critical dimension measurement result of a photoresist pattern.

Objectives of the present disclosure are not limited to the above-described object, and other objectives which are not described above will be clearly understood by those skilled in the art from the following description.

According to an exemplary embodiment of the present disclosure, a method for measuring a critical dimension of a photoresist includes obtaining intensity data by scanning a target substrate on which photoresist patterns are disposed, setting a plurality of unit areas, extracting the intensity data corresponding to the unit areas, calculating corrected intensity data at the unit areas by processing the extracted intensity data, and calculating critical dimension data of the photoresist patterns of the unit areas from the corrected intensity data, wherein the obtaining of the intensity data by scanning the target substrate includes setting a first scan area and a second scan area overlapping the first scan area and having a same width as the first scan area, obtaining first intensity data by scanning the first scan area, and obtaining second intensity data by scanning the second scan area.

In an exemplary embodiment, the first scan area includes a first subarea defined at one side and a second subarea defined at the other side; and the second scan area overlaps the second subarea of the first scan area. In an exemplary embodiment, a width of the first subarea in the first scan area is substantially equal to a width of the second subarea in the first scan area.

In an exemplary embodiment, the second scan area includes a first subarea defined at one side and a second subarea defined at the other side, and the first subarea of the second scan area overlaps the second subarea of the first scan area. In an exemplary embodiment, a width of the second subarea in the first scan area is substantially equal to a width of the first subarea in the second scan area.

In an exemplary embodiment, a first overlapping area defined as an area in which the first scan area overlaps the second scan area. In an exemplary embodiment, the setting of the plurality of the unit areas includes setting a first unit area in the first overlapping area.

In an exemplary embodiment, the calculating of the corrected intensity data includes calculating first corrected intensity data by extracting the first intensity data and the second intensity data which correspond to the first unit area. In an exemplary embodiment, the calculating of the first corrected intensity data includes averaging the first intensity data and the second intensity data which correspond to the first unit area.

In an exemplary embodiment, a width of the first overlapping area is substantially equal to a width of the first unit area. In an exemplary embodiment, the obtaining of the intensity data by scanning the target substrate further includes obtaining third intensity data by scanning a third scan area which overlaps the second scan area.

In an exemplary embodiment, the second scan area includes a first subarea defined at one side and a second subarea defined at the other side; the first subarea of the second scan area overlaps the first scan area; and the second subarea of the second scan area overlaps the third scan area. In an exemplary embodiment, a width of the first subarea in the second scan area is substantially equal to a width of the second subarea therein.

In an exemplary embodiment, a first overlapping area defined as an area in which the first subarea of the second scan area overlaps the first scan area, and a second overlapping area defined as an area in which the second subarea of the second scan area overlaps the third scan area.

In an exemplary embodiment, setting of the plurality of the unit areas includes setting a first unit area in the first overlapping area; and setting a second unit area in the second overlapping area. In an exemplary embodiment, a width of the first unit area is substantially equal to a width of the first overlapping area. In an exemplary embodiment, a width of the first overlapping area is substantially equal to a width of the second overlapping area.

In an exemplary embodiment, the calculating of the corrected intensity data includes calculating first corrected intensity data by extracting the first intensity data and the second intensity data which correspond to the first unit area; and calculating second corrected intensity data by extracting the second intensity data and the third intensity data which correspond to the second unit area.

In an exemplary embodiment, the calculating of the first corrected intensity data includes averaging the first intensity data and the second intensity data which correspond to the first unit area; and the calculating of the second corrected intensity data includes averaging the second intensity data and the third intensity data which correspond to the second unit area.

In an exemplary embodiment, calculating critical dimension data of the photoresist patterns of the first unit area and the second unit area from the first corrected intensity data and the second corrected intensity data; and generating a critical dimension change map of the photoresist patterns of the target substrate by aggregating the critical dimension data of the first unit area and the second unit area.

According to another embodiment, a system for measuring a critical dimension is described, the system comprising a controller configured to control an apparatus to identify a first scan area of a target substrate and a second scan area of the target substrate overlapping the first scan area; emit first light onto the first scan area and second light onto the second scan area; measure intensity of the first light reflected from the first scan area and of the second light reflected from the second scan area; obtain first intensity data for a unit area overlapping the first scan area based on the first light, and second intensity data for the unit area based on the second light; calculate corrected intensity data for the unit areas by based on the first intensity data and the second intensity data; and calculate critical dimension data of a photoresist patterns of the unit area based on the corrected intensity data.

BRIEF DESCRIPTION OF THE DRAWINGS

The above and other aspects and features of the present disclosure will become more apparent by describing exemplary embodiments thereof in detail with reference to the attached drawings, in which.

DETAILED DESCRIPTION OF THE EMBODIMENTS

The present disclosure describes systems and methods for measuring a critical dimension of a photoresist pattern.

Some embodiments include setting a first and a second scan overlapping scan areas, obtaining first intensity data by scanning the first scan area, and obtaining second intensity data by scanning the second scan area. Accordingly, even if light emitted by the light source has non-uniform light intensity in a first direction, corrected intensity data may be calculated by averaging the intensity data in the overlapping areas in the scan areas. Since the non-uniform intensity of the light emitted by the light source can be corrected, reliability of the measurement result can be improved.

The present disclosure will now be described more fully hereinafter with reference to the accompanying drawings, in which embodiments of the present disclosure are shown. This disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, the layer can be directly on the other layer or substrate, or intervening layers may also be present. In contrast, when an element is referred to as being "directly on" another element, there are no intervening elements present.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed as the first element.

Hereinafter, specific embodiments will be described with reference to the accompanying drawings.

In the present specification, a first direction dr1 denotes an X-axis direction, a second direction dr2 denotes a Y-axis direction, and a third direction dr3 denotes a Z-axis direction.

Figure 1:
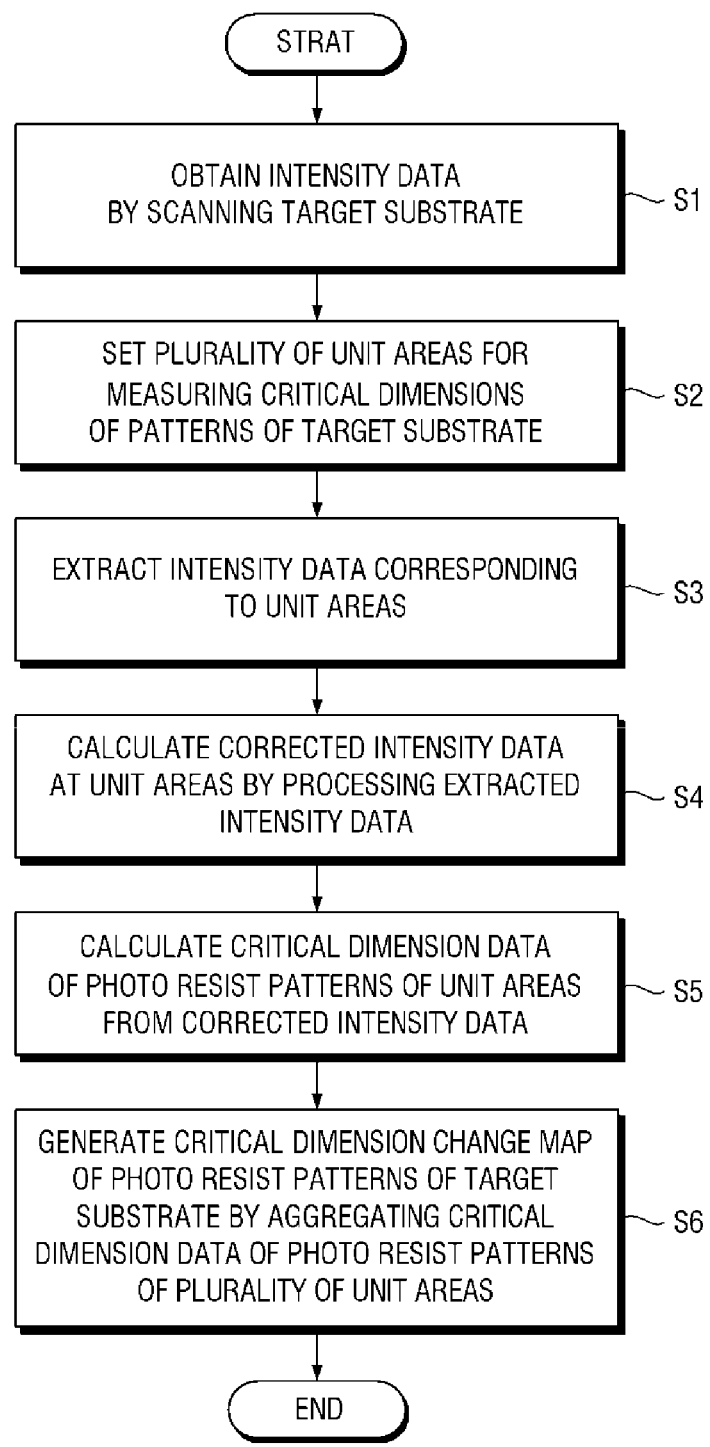
FIG. 1 is a flowchart for describing a method for measuring a critical dimension of a photoresist pattern according to embodiments of the present disclosure.

FIG. 1 is a flowchart for describing a method for measuring a critical dimension of a photoresist pattern according to embodiments of the present disclosure.

Referring to FIG. 1, the method for measuring a critical dimension of a photoresist pattern, according to one embodiment, may include obtaining intensity data by scanning a target substrate (S1) and setting a plurality of unit areas for measuring critical dimensions of patterns of the target substrate (S2). Additionally, the method may include extracting intensity data corresponding to the unit areas (S3), calculating corrected intensity data at the unit areas by processing the extracted intensity data (S4). Also, the method may include calculating critical dimension data of the photoresist patterns of the unit areas from the corrected intensity data (S5), and generating a critical dimension change map of the photoresist patterns of the target substrate by aggregating the critical dimension data of the photoresist patterns of the plurality of unit areas (S6).

First, according to an embodiment of the method for measuring a critical dimension of a photoresist pattern, the target substrate SUB is scanned to obtain the intensity data (S1). The scanning of the target substrate SUB may be performed by a measurement apparatus 1 illustrated in FIG. 2.

Figure 2:
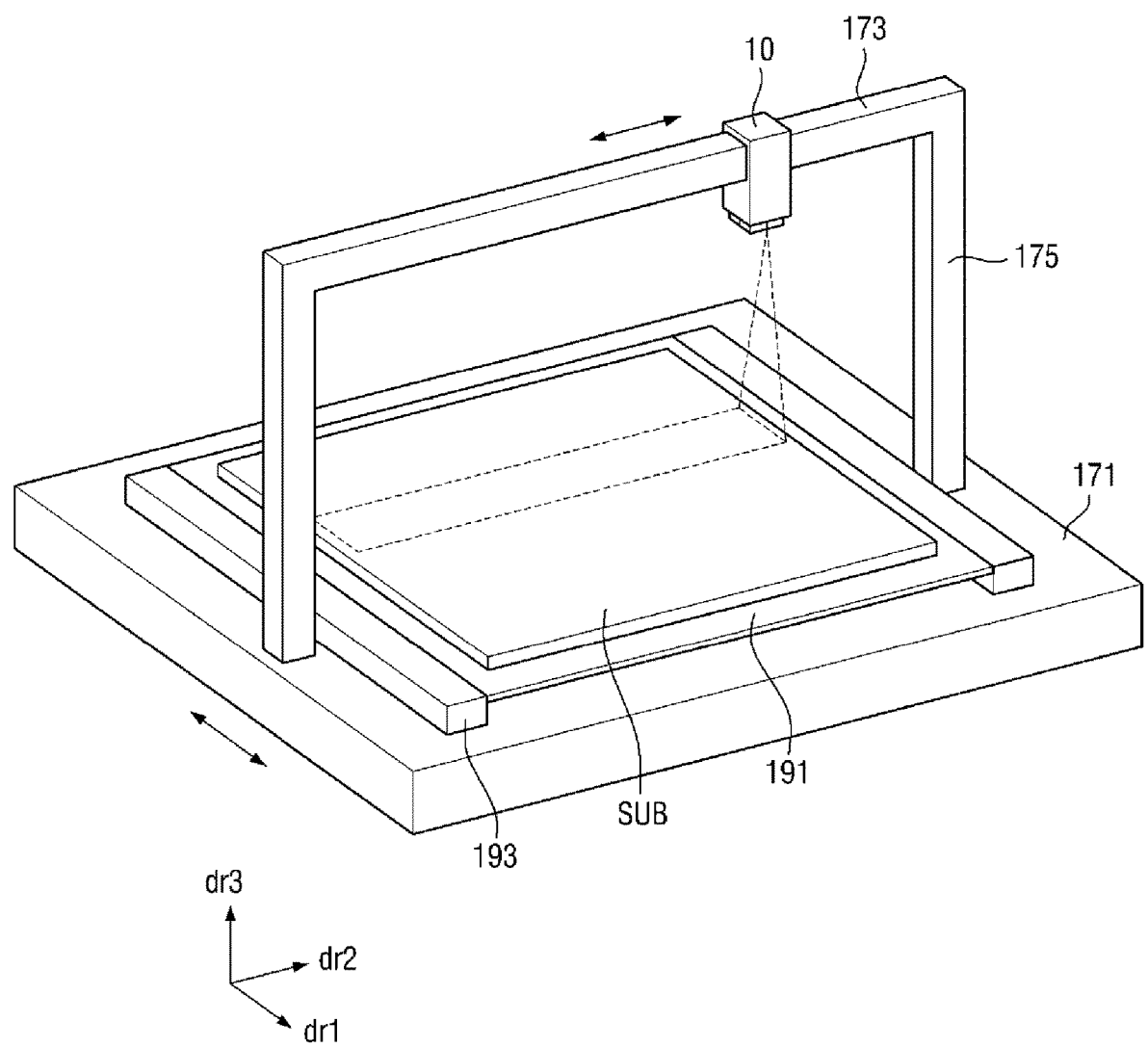
FIG. 2 is a perspective view illustrating a measurement apparatus used in the method for measuring a critical dimension of a photoresist pattern according to embodiments of the present disclosure.

FIG. 2 is a perspective view illustrating the measurement apparatus used in the method for measuring a critical dimension of a photoresist pattern according to embodiments of the present disclosure.

Referring to FIG. 2, the measurement apparatus 1 may include a base frame 171, a stage 191, a stage mover 193, a scan system 10, a horizontal support 173, and a vertical support 175.

The stage 191 may be disposed on the base frame 171. The stage 191 may provide a space on which the target substrate SUB is disposed. The target substrate SUB may be seated on the stage 191 such that critical dimensions of the photoresist patterns formed on the target substrate SUB are measured.

The target substrate SUB will be described in detail with reference to FIG. 3.

Figure 3:
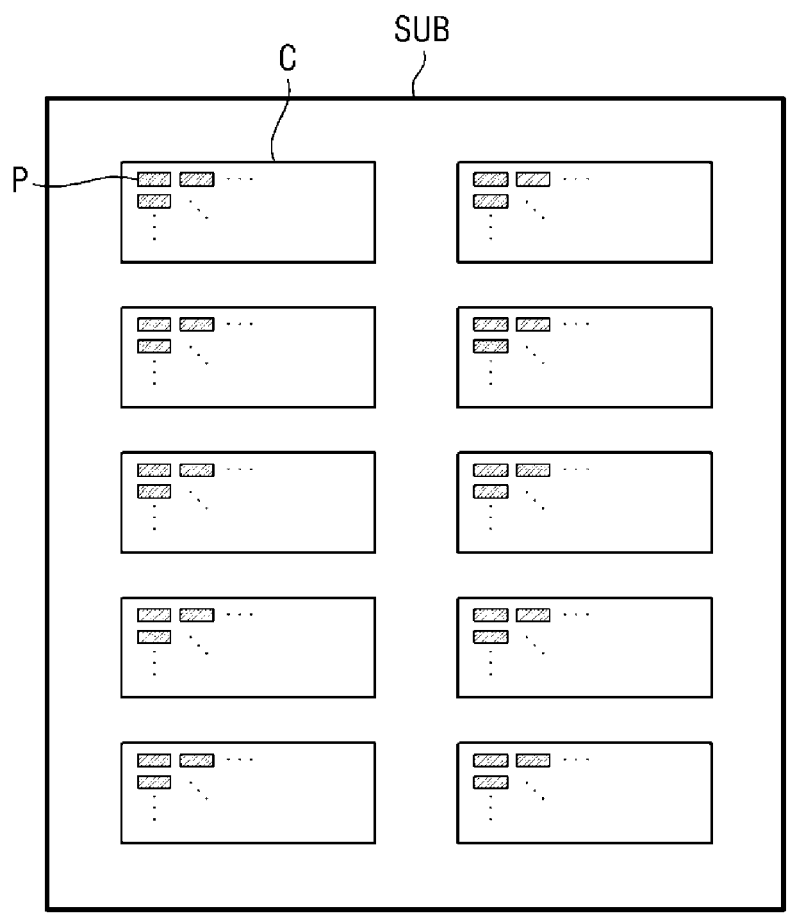
FIG. 3 is a plan view illustrating a target substrate of FIG. 2.
Figure 3:
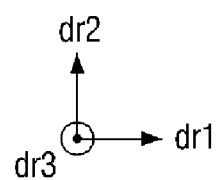

FIG. 3 is a plan view illustrating the target substrate of FIG. 2.

Referring to FIG. 3, the target substrate SUB is a substrate of a display and may include a plurality of cells C. In the drawing, a case is illustrated in which one target substrate SUB includes ten cells C, but an arrangement and the number of cells C are not limited thereto.

A plurality of photoresist patterns P may be disposed in the cells C of the target substrate SUB. The plurality of photoresist patterns P may be formed through a photolithography process. The photolithography process includes a process of applying a photosensitive material, such as a photoresist material, on a substrate. Additionally, the photolithography process includes exposing the photosensitive material to light using a mask, selectively developing the photosensitive material using a developer, and forming the photoresist patterns P corresponding to patterns of the mask.

A difference in pattern density may occur according to positions of the cells C in the process of forming the photoresist patterns P or a photo loading effect may occur in the developing process due to movement of the developer. Accordingly, a problem may occur in which the critical dimensions of the photoresist patterns P are not uniform, and electrical characteristics of a transistor are affected. As a result, display quality of the display may degrade. Accordingly, to control the photo loading effect, precise measurements of the critical dimensions of the photoresist patterns P of the target substrate SUB are used. The measurement of the critical dimensions of the photoresist patterns P may be performed by the scan system 10 which will be described below.

Referring to FIG. 2 again, a substantially flat shape of the stage 191 may correspond to a flat shape of the target substrate SUB. For example, in a case in which the target substrate SUB has a rectangular shape, a substantial shape of the stage 191 may be a rectangular shape. In a case in which the target substrate SUB has a circular shape, a substantial shape of the stage 191 may be a circular shape.

The stage 191 may be fixed by the stage mover 193. The stage mover 193 may be installed on the base frame 171, and the stage 191 may be moved by the stage mover 193. The stage mover 193 may move the stage 191 in a longitudinal or lateral direction within a predetermined range. For example, the stage mover 193 may move the stage 191 in the first direction dr1, or a direction opposite to the first direction dr1. The stage mover 193 may be omitted in some cases. In the case in which the stage mover 193 is omitted, a mover configured to move the scan system 10 in the first direction dr1 may be further included in the measurement apparatus 1.

The scan system 10 may be positioned to be spaced upward (in the third direction dr3) from the stage 191. The scan system 10 may scan the target substrate SUB and obtain intensity data of the photoresist patterns P formed on the target substrate SUB. For example, the scan system 10 may scan the target substrate SUB in the second direction dr2.

The intensity data may be sent to a data processor 190, which will be described below, and critical dimension data of the photoresist patterns P may be calculated.

The scan system 10 may be disposed on the support and spaced a predetermined distance from the stage 191. The support may include the horizontal support 173, which extends in a horizontal direction. Additionally, the vertical supports 175 is a vertical direction, which are connected to the horizontal support 173 and extend in the third direction dr3. The direction in which the horizontal support 173 extends may be the same as the second direction dr2, which is a scan direction of the scan system 10. The horizontal support 173 may provide a passage on which the scan system 10 may be disposed and may scan the target substrate SUB. Since the scan system 10 horizontally moves on the horizontal support 173, the scan system 10 with an area less than an area of the target substrate SUB may scan the entire area of the target substrate SUB and collect the intensity data.

Meanwhile, in the drawing, a case is illustrated in which the measurement apparatus 1 includes one scan system 10, but the present disclosure is not limited thereto. For example, the measurement apparatus 1 may include a plurality of scan systems 10. The plurality of scan systems 10 may be disposed on one horizontal support 173 and may simultaneously scan the target substrate SUB. In this case, a time period in which the entire area of the target substrate SUB is scanned may be decreased when a scanned area is increased due to the scan systems 10.

Hereinafter, a configuration of the scan system 10 will be described in detail.

Figure 4:
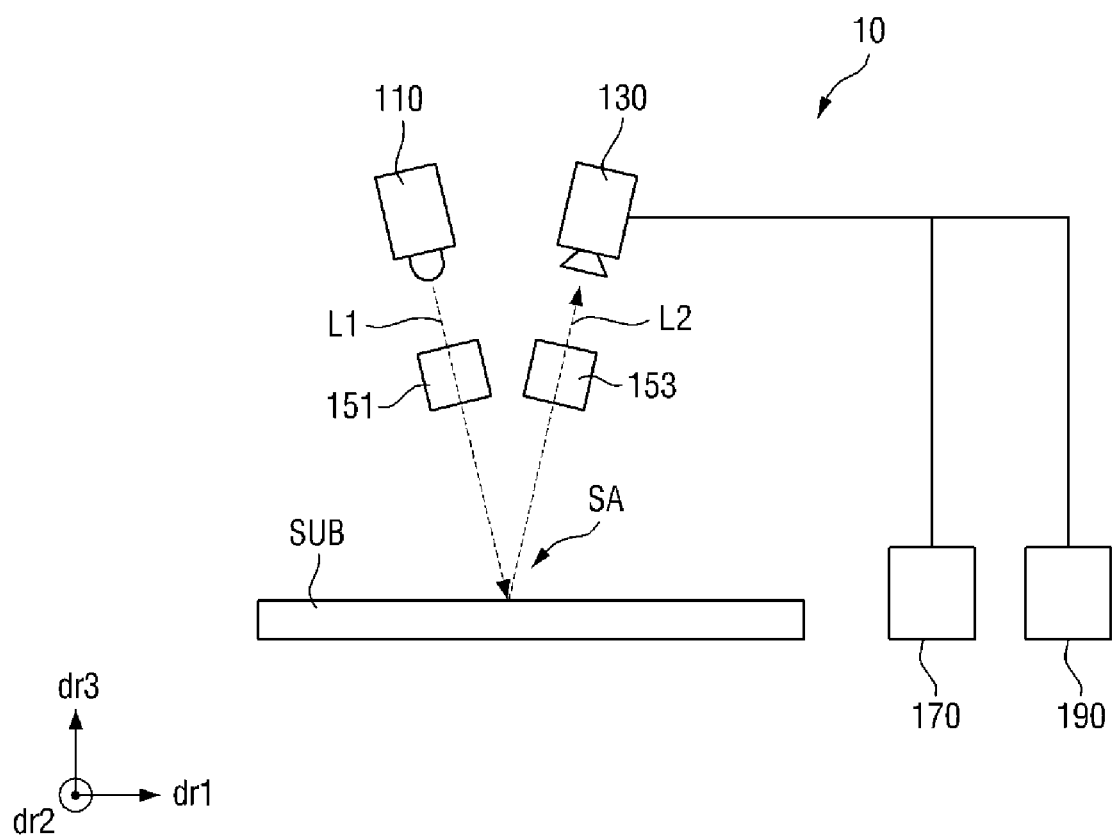
FIG. 4 is a schematic view illustrating a scan system of the measurement apparatus of FIG. 2.

FIG. 4 is a schematic view illustrating the scan system of the measurement apparatus of FIG. 2.

Referring to FIG. 4, the scan system 10 may include a light source 110, a sensor 130, a plurality of optical systems 151 and 153, a controller 170, and the data processor 190.

The light source 110 may emit first light L1 on one surface of the target substrate SUB to measure critical dimensions of photoresist patterns P formed on the target substrate SUB. The first light L1 emitted from the light source 110 may be emitted to a scan area SA of the target substrate SUB. The light source 110 may be disposed to be space apart from an upper surface of the target substrate SUB.

Generally, an intensity of light emitted by the light source 110 may have a non-uniform profile according to an area to which the light is emitted. In this case, the first light L1 emitted to the target substrate SUB may have non-uniform intensity in one direction. For example, the first light L1 emitted to the target substrate SUB may have the non-uniform intensity in the first direction dr1 intersecting the second direction dr2 which is the scan direction. Accordingly, a large variation may occur in intensity data measured by the sensor 130, and a large variation may occur in critical dimension data calculated therefrom. Then, according to an embodiment of the method for measuring a critical dimension of a photoresist pattern, non-uniform intensity of light of the light source can be corrected when a plurality of overlapping scan areas are scanned to corrected intensity data. The detailed description thereof will be described below.

Second light L2 reflected from the scan area SA of the target substrate SUB may be detected by the sensor 130. The sensor 130 may measure an intensity of the second light L2 reflected by one surface of the target substrate SUB and output intensity data. The intensity data may be provided to the data processor 190 which will be described below. The sensor 130 may be, for example, a charge-coupled device (CCD) or time-delay integration (TDI) camera but is not limited thereto.

The plurality of optical systems 151 and 153 may include a first optical system 151 and a second optical system 153.

The first optical system 151 may be disposed between the light source 110 and the target substrate SUB. The first light L1 emitted from the light source 110 may pass through the first optical system 151 and be emitted to the target substrate SUB. For example, the first optical system 151 may be provided on a passage of the first light L1. The first optical system 151 may serve to focus the first light L1 such that the first light L1 is emitted to the scan area SA of the target substrate SUB. To this end, the first optical system 151 may include one or more lenses. However, the present disclosure is not limited thereto, and the first optical system 151 may further include a spectrum filter, a refraction or reflection optical element, or the like.

The second optical system 153 may be disposed between the target substrate SUB and the sensor 130. The second light L2 reflected by the target substrate SUB may pass through the second optical system 153 and be provided to the sensor 130. For example, the second optical system 153 may be provided on a passage of the second light L2. The second optical system 153 may serve to converge the second light L2, which is reflected or scattered by the target substrate SUB at different angles, on the sensor 130. To this end, the second optical system 153 may include one or more lenses.

In the drawing, one first optical system 151 and one second optical system 153 are illustrated, but the present disclosure is not limited thereto. For example, each of the first optical system 151 and the second optical system 153 may include a plurality of optical systems. Additionally, any one optical system of the first optical system 151 and the second optical system 153 may also be omitted.

The controller 170 may control the light source 110 and the sensor 130 to move. For example, the sensor 130, with an area less than the area of the target substrate SUB, may scan the entire area of the target substrate SUB and output intensity data when the controller 170 horizontally moves the light source 110 and the sensor 130 in the second direction dr2.

The data processor 190 may be connected to the sensor 130. The intensity data output by the sensor 130 may be sent to the data processor 190 and processed or corrected. The intensity data and critical dimension data of the photoresist patterns P will be described in detail below.

Thus, according to an embodiment, a scan system for measuring a critical dimension may include a controller 170 and, additionally or alternatively, a data processor 190 configured to control an apparatus to identify a first scan area of a target substrate and a second scan area of the target substrate overlapping the first scan area; emit first light onto the first scan area and second light onto the second scan area; measure intensity of the first light reflected from the first scan area and of the second light reflected from the second scan area; obtain first intensity data for a unit area overlapping the first scan area based on the first light, and second intensity data for the unit area based on the second light; calculate corrected intensity data for the unit areas by based on the first intensity data and the second intensity data; and calculate critical dimension data of a photoresist patterns of the unit area based on the corrected intensity data.

Figure 5:
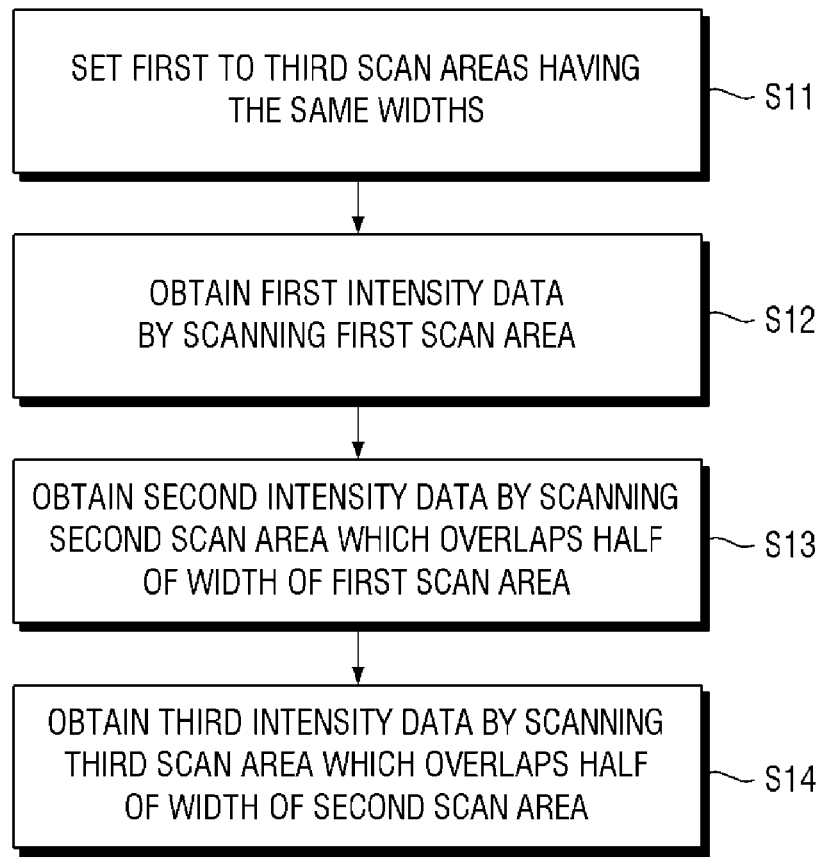
FIG. 5 is a detailed flowchart of operation S1 of FIG. 1.
Figure 6:
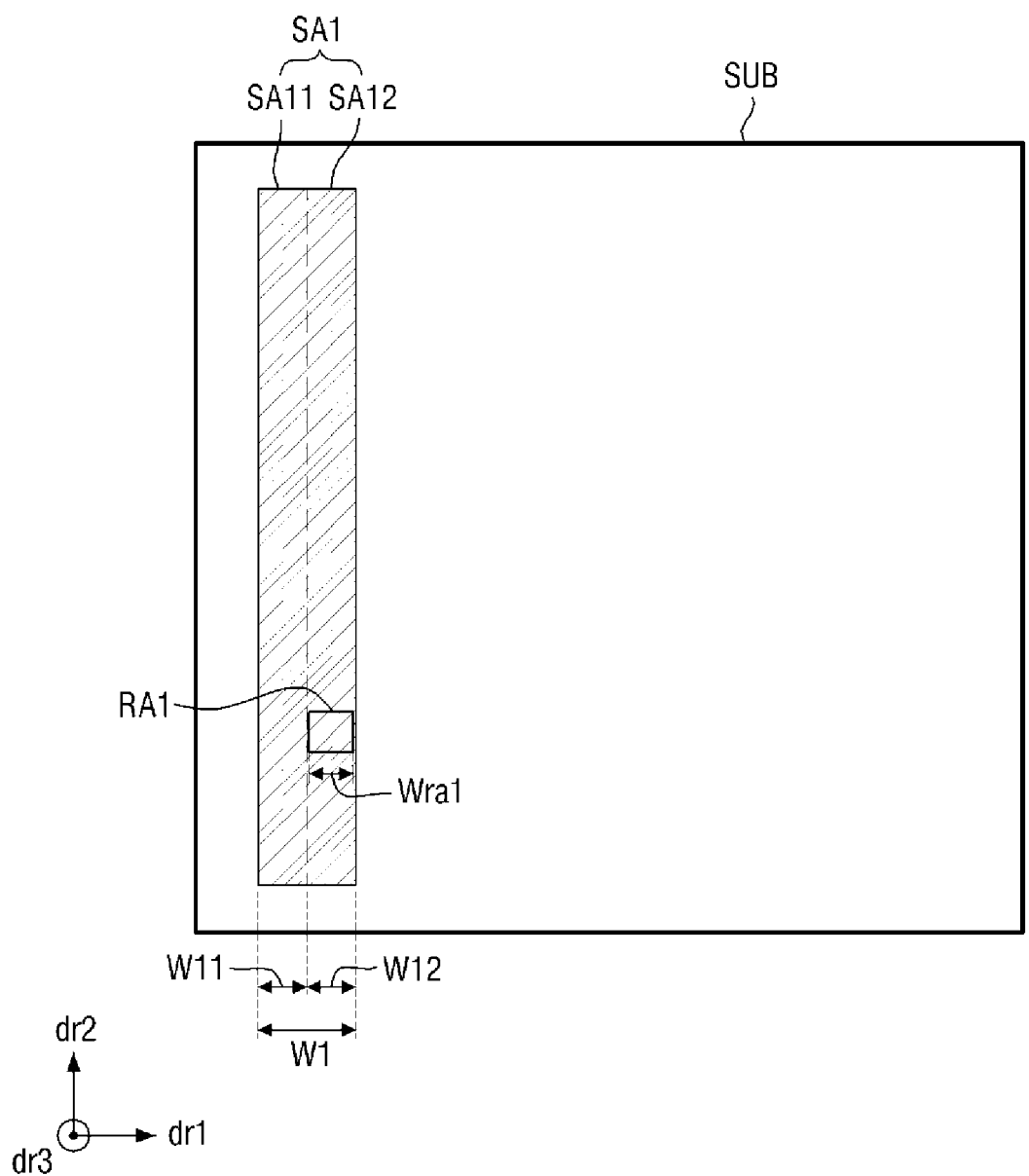
FIGS. 6 to 8 are example views for describing the method for measuring a critical dimension of a photoresist pattern according to embodiments of the present disclosure.
Figure 7:
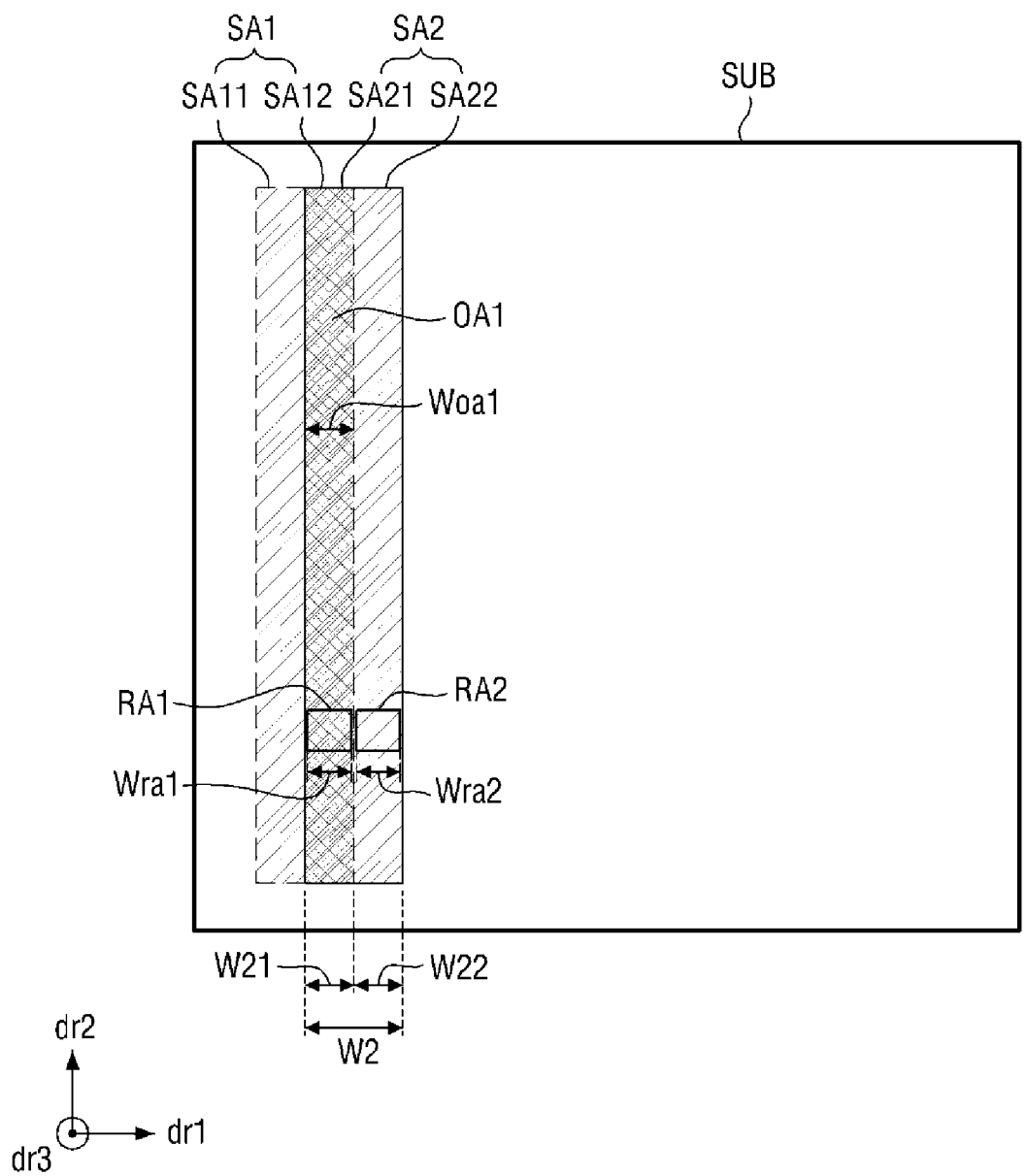
Figure 8:
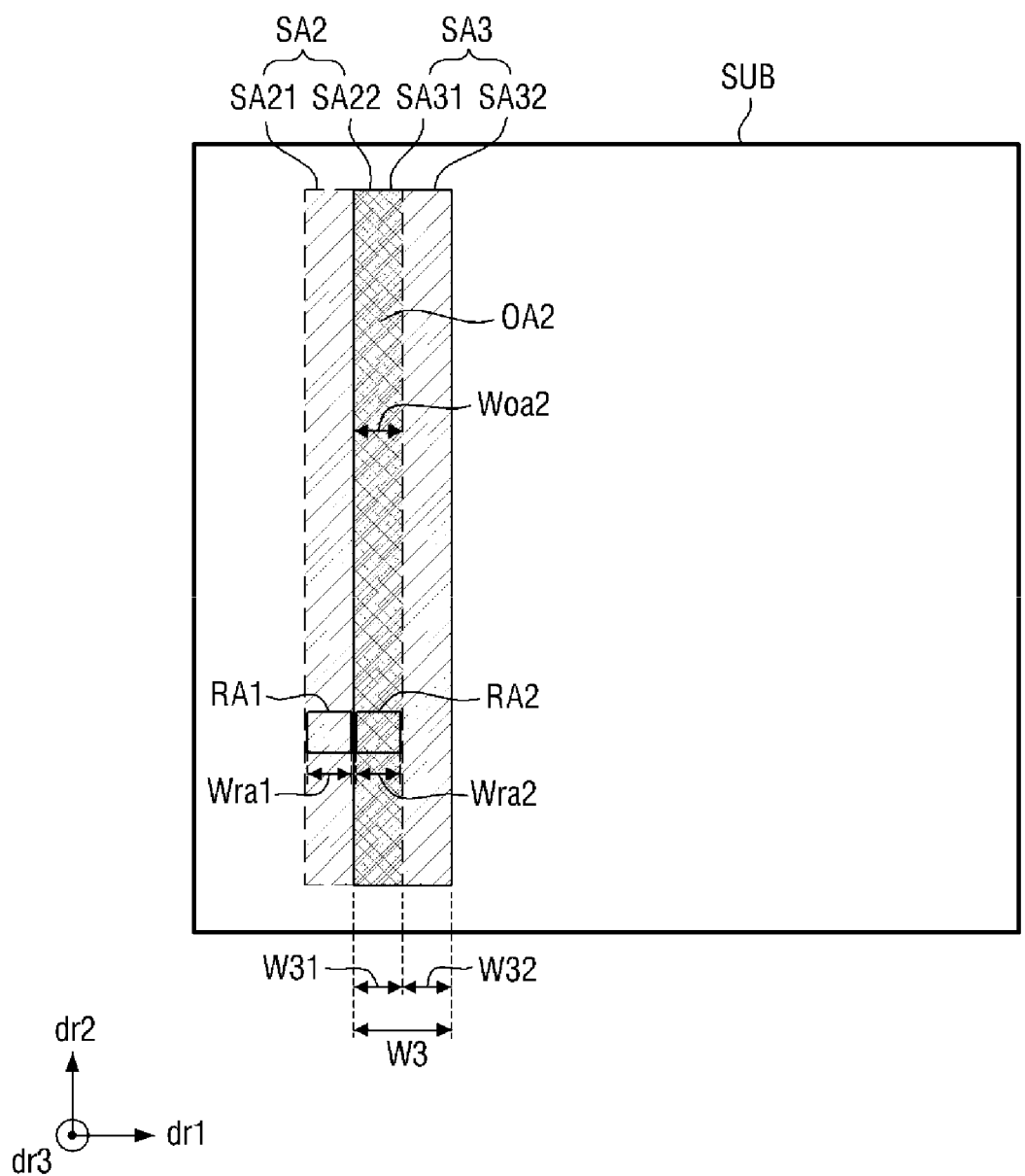
Figure 9:
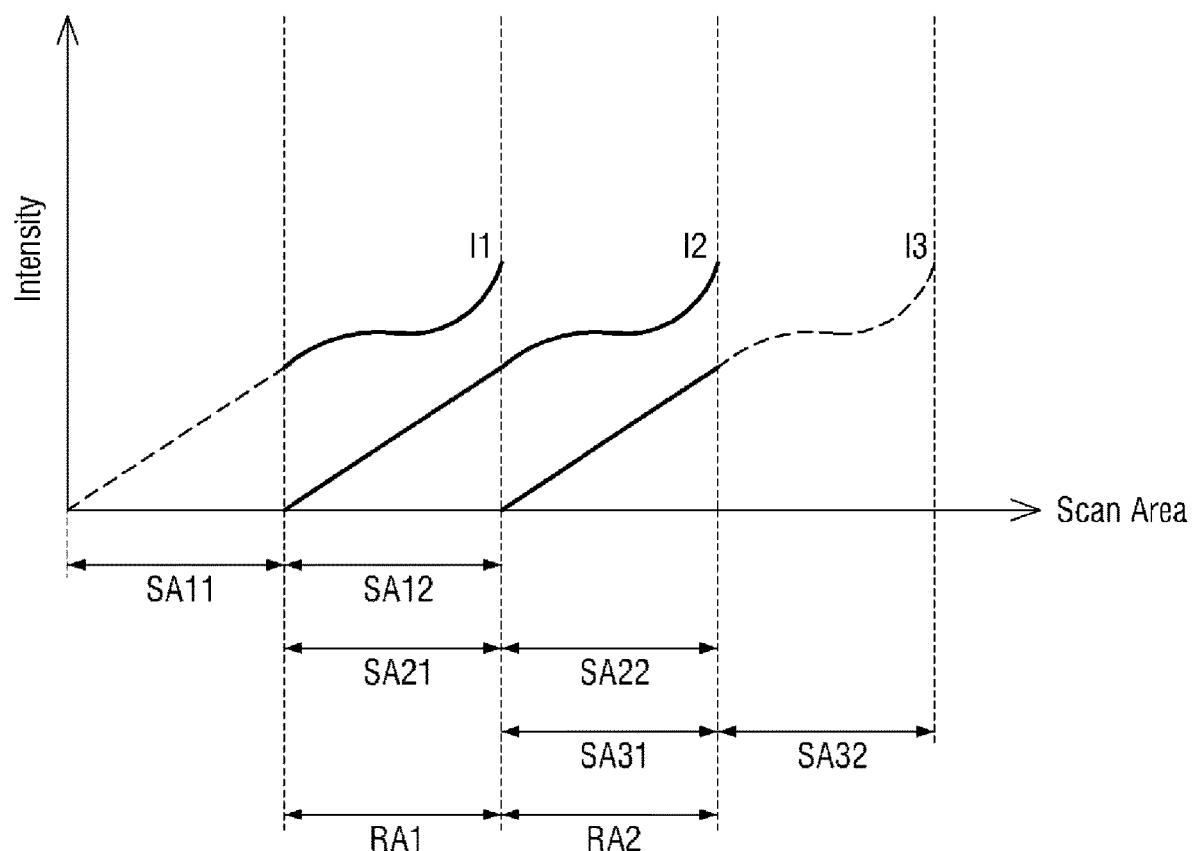
FIGS. 9 and 10 are reference views for describing the method for measuring a critical dimension of a photoresist pattern according to embodiments of the present disclosure.
Figure 10:
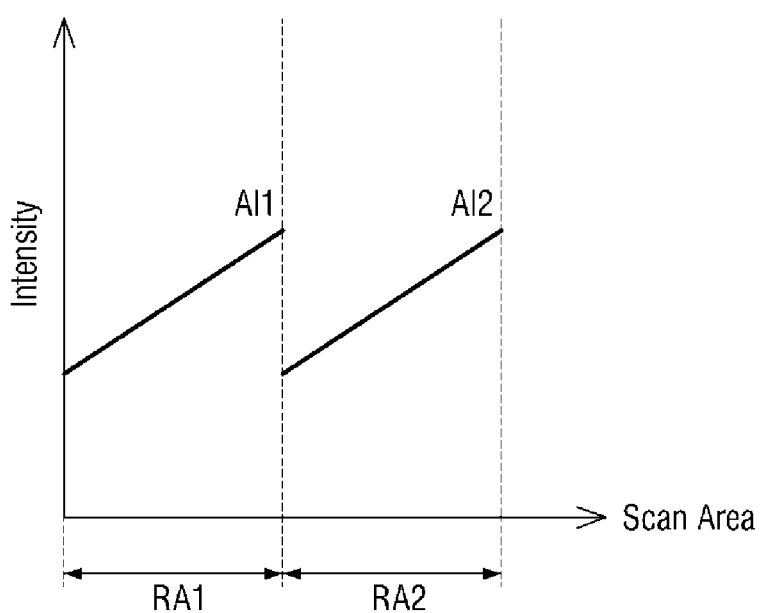

FIG. 5 is a detailed flowchart of operation S1 of FIG. 1. FIGS. 6 to 8 are example views for describing the method for measuring a critical dimension of a photoresist pattern according to embodiments of the present disclosure. FIGS. 9 and 10 are reference views for describing the method for measuring a critical dimension of a photoresist pattern according to embodiments of the present disclosure.

Referring to FIG. 5, obtaining the intensity data by scanning the target substrate SUB (S1) may include setting first to third scan areas with the same widths (S11). And obtaining first intensity data by scanning the first scan area (S12). Additionally, obtaining the intensity data may include obtaining second intensity data by scanning the second scan area, which overlaps half of the width of the first scan area (S13), and obtaining third intensity data by scanning the third scan area which overlaps half of the width of the second scan area (S14).

First, referring to FIG. 6, the first intensity data is obtained by scanning the first scan area SA1 (S12). The first scan area SA1 may extend in one direction when viewed from above. For example, as illustrated in FIG. 6, the first scan area SA1 may extend in the second direction dr2.

The width W1 of the first scan area SA1 may be set by considering a first unit area RA1 which will be described below. Here, the width W1 of the first scan area SA1 may be a width of the first scan area SA1 in the first direction dr1.

The first scan area SA1 may include a first subarea SA11 defined at one side and a second subarea SA12 defined at the other side.

The first subarea SA11 and the second subarea SA12 of the first scan area SA1 may extend in one direction when viewed from above. For example, as illustrated in FIG. 6, the first subarea SA11 and the second subarea SA12 of the first scan area SA1 may extend in the second direction dr2.

A width W11 of the first subarea SA11 and a width W12 of the second subarea SA12 of the first scan area SA1 may be substantially the same. For example, the width W11 of the first subarea SA11 of the first scan area SA1 may be half of the width W1 of the first scan area SA1. Similarly, the width W12 of the second subarea SA12 of the first scan area SA1 may be the half of the width W1 of the first scan area SA1. Here, the width of each of the subareas may be a width in the first direction dr1.

Next, referring to FIG. 7, the second intensity data is obtained by scanning the second scan area SA2 which overlaps the half of the width W1 of the first scan area SA1 (S13).

The second scan area SA2 may be set to overlap the half of the width W1 of the first scan area SA1. For example, the second subarea SA12 of the first scan area SA1. Here, an area in which the second scan area SA2 overlaps the first scan area SA1 may be defined as a first overlapping area OA1.

The second scan area SA2 may include a first subarea SA21 defined at one side and a second subarea SA22 defined at the other side. Here, the first subarea SA21 of the second scan area SA2 may be defined to overlap the second subarea SA12 of the first scan area SA1.

The width W2 of the second scan area SA2 may be substantially equal to the width W1 of the first scan area SA1.

A width W21 of the first subarea SA21 in the second scan area SA2 may be substantially equal to a width W22 of the second subarea SA22 therein. For example, the width W21 of the first subarea SA21 of the second scan area SA2 may be half of the width W2 of the second scan area SA2. Similarly, the width W22 of the second subarea SA22 of the second scan area SA2 may be the half of the width W2 of the second scan area SA2.

The width W21 of the first subarea SA21 of the second scan area SA2 may be the same as the width W12 of the second subarea SA12 of the first scan area SA1 when the first subarea SA21 of the second scan area SA2 overlaps the second subarea SA12 of the first scan area SA1. For example, a width Woa1 of the first overlapping area OA1 may be the same as each of the width W12 of the second subarea SA12 of the first scan area SA1 and the width W21 of the first subarea SA21 of the second scan area SA2.

Next, referring to FIG. 8, the third intensity data is obtained by scanning the third scan area SA3 which overlaps the half of the width W2 of the second scan area SA2 (S14).

The third scan area SA3 may be defined to overlap the half of the width W2 of the second scan area SA2. For example, the second subarea SA22 of the second scan area SA2. Here, an area in which the third scan area SA3 overlaps the second scan area SA2 may be defined as a second overlapping area OA2.

The third scan area SA3 may include a first subarea SA31 defined at one side and a third subarea SA32 defined at the other area. Here, the first subarea SA31 of the third scan area SA3 may be defined to overlap the second subarea SA22 of the second scan area SA2.

The width W3 of the third scan area SA3 may be substantially equal to the width W2 of the second scan area SA2.

A width W31 of the first subarea SA31 in the third scan area SA3 may be substantially equal to a width W32 of the second subarea SA32 therein. For example, the width W31 of the first subarea SA31 of the third scan area SA3 may be half of the width W3 of the third scan area SA3. Similarly, the width W32 of the second subarea SA32 of the third scan area SA3 may be the half of the width W3 of the third scan area SA3.

The width W31 of the first subarea SA31 of the third scan area SA3 may be the same as the width W22 of the second subarea SA22 of the second scan area SA2 when the first subarea SA31 of the third scan area SA3 overlaps the second subarea SA22 of the second scan area SA2. For example, a width Woa2 of the second overlapping area OA2 may be the same as each of the width W22 of the second subarea SA22 of the second scan area SA2 and the width W31 of the first subarea SA31 of the third scan area SA3.

Referring to FIG. 9, the first intensity data I1, the second intensity data I2, and the third intensity data I3 may be respectively obtained from the first scan area SA1, the second scan area SA2, and the third scan area SA3 in above-described operations S11, S12, S13, and S14.

The first intensity data I1, the second intensity data I2, and the third intensity data I3 may be sent to the data processor 190. The data processor 190 may perform a data processing operation thereon to generate a critical dimension change map.

Referring to FIGS. 6 to 8, the plurality of unit areas RA1 and RA2 are set to measure the critical dimensions of the photoresist patterns P of the target substrate SUB (S2).

The plurality of unit areas RA1 and RA2 may be predetermined areas that the target substrate SUB in which the critical dimensions of the photoresist patterns P should be measured is divided. The unit areas RA1 and RA2 may be set by considering a takt time or resolution used by the critical dimension change map of the photoresist patterns.

The plurality of unit areas RA1 and RA2 may be properly defined in the above-described scan areas SA1, SA2, and SA3. The plurality of unit areas RA1 and RA2 may be properly defined within the overlapping areas OA1 and OA2 in which the scan areas SA1, SA2, and SA3 overlap each other.

The plurality of unit areas RA1 and RA2 may include a first unit area RA1 and a second unit area RA2.

The first unit area RA1 may be selected from the first overlapping area OA1, and the second unit area RA2 may be selected from the second overlapping area OA2. In this case, widths of the unit areas RA1 and RA2 may be defined to be the same as widths of the overlapping areas OA1 and OA2. For example, the width Wra1 of the first unit area RA1 may be substantially equal to the width Woa1 of the first overlapping area OA1. In addition, the width Wra2 of the second unit area RA2 may be substantially equal to the width Woa2 of the second overlapping area OA2.

Referring to FIG. 9, the intensity data I1, I2, and I3 corresponding to the unit areas RA1 and RA2 are extracted (S3).

The first intensity data I1 and the second intensity data I2 which correspond to the first unit area RA1 are extracted. Additionally, the second intensity data I2 and the third intensity data I3 which correspond to the second unit area RA2 are extracted.

The first intensity data I1, the second intensity data I2, and the third intensity data I3 may show similar trends in the scan areas SA1, SA2, and SA3. This is because of non-uniform intensity of light emitted from the light source 110, and the light source 110 may have non-uniform intensity in the first direction dr1. Due to this, when the first intensity data I1, the second intensity data I2, and the third intensity data I3, which are output by the scan system 10, are extracted by scanning the same area, intensities in the first subareas SA11, SA21, and SA31 and the second subareas SA12, SA22, and SA32 of the scan areas SA1, SA2, and SA3 may be different.

According to an embodiment of the method for measuring the photoresist patterns, the intensity data I1, I2, and I3 corresponding to the unit areas RA1 and RA2 are extracted, and corrected intensity data AI1 and AI2 (shown in FIG. 10) at the unit areas RA1 and RA2 are calculated (S4).

Referring to FIGS. 9 and 10, the first intensity data I1 and the second intensity data I2 which correspond to the first unit area RA1 are extracted, and the first corrected intensity data AI1 is calculated.

The calculating of the first corrected intensity data AI1 may include averaging the first intensity data I1 and the second intensity data I2 which correspond to the first unit area RA1.

In addition, the second intensity data I2 and the third intensity data I3 which correspond to the second unit area RA2 are extracted and the second corrected intensity data AI2 is calculated.

The calculating of the second corrected intensity data AI2 includes averaging the second intensity data I2 and the third intensity data I3 which correspond to the second unit area RA2.

Accordingly, the corrected intensity data AI1 and AI2 may be calculated by averaging the intensity data I1, I2, and I3 in the overlapping areas OA1 and OA2 in the scan areas SA1, SA2, and SA3 when light emitted by the light source 110 has non-uniform light intensity in the first direction dr1. For example, reliability of the measurement result may be increased when the non-uniform intensity of the light emitted by the light source 110 can be corrected.

Next, the critical dimension data of the photoresist patterns P of the unit areas RA1 and RA2 are calculated from the corrected intensity data AI1 and AI2 (S5). Additionally, the critical dimension change map of the photoresist patterns P of the target substrate SUB is generated by aggregating the critical dimension data of the photoresist patterns P in the plurality of unit areas RA1 and RA2 (S6).

According to an embodiment of the method for measuring the photoresist patterns, effects due to the non-uniform intensity of the light emitted by the light source 110 may be minimized since the intensities of the photoresist patterns are corrected using the intensity data obtained from the overlapping areas OA1 and OA2 in the scan areas SA1, SA2, and SA3. Accordingly, the reliability of critical dimension measurement results of the photoresist patterns can be increased.

According to an embodiment of the method for measuring a critical dimension of a photoresist pattern, reliability of measurement results can be increased when non-uniform intensity of light emitted by a light source can be corrected.

In concluding the detailed description, those skilled in the art will appreciate that many variations and modifications can be made to the embodiments without substantially departing from the principles of the present disclosure. Therefore, the embodiments of the present disclosure are used in a generic and descriptive sense only and not for purposes of limitation.

What is claimed is:

1. A method for measuring a critical dimension of a photoresist comprising:
    obtaining intensity data by scanning a target substrate on which photoresist patterns are disposed;
    setting a plurality of unit areas;
    extracting the intensity data corresponding to the unit areas;
    calculating corrected intensity data at the unit areas by processing the extracted intensity data; and
    calculating critical dimension data of the photoresist patterns of the unit areas from the corrected intensity data,
    wherein the obtaining of the intensity data by scanning the target substrate includes setting a first scan area and a second scan area overlapping the first scan area and having a same width as the first scan area, obtaining first intensity data by scanning the first scan area, and obtaining second intensity data by scanning the second scan area.

2. The method of claim 1, wherein:
    the first scan area includes a first subarea defined at one side and a second subarea defined at the other side; and
    the second scan area overlaps the second subarea of the first scan area.

3. The method of claim 2, wherein a width of the first subarea in the first scan area is substantially equal to a width of the second subarea in the first scan area.

4. The method of claim 2, wherein:
    the second scan area includes a first subarea defined at one side and a second subarea defined at the other side; and
    the first subarea of the second scan area overlaps the second subarea of the first scan area.

5. The method of claim 4, wherein a width of the second subarea in the first scan area is substantially equal to a width of the first subarea in the second scan area.

6. The method of claim 1, wherein the first scan area overlaps the second scan area in a first overlapping area.

7. The method of claim 6, wherein setting the plurality of unit areas includes setting a first unit area in the first overlapping area.

8. The method of claim 7, wherein calculating the corrected intensity data includes calculating first corrected intensity data by extracting the first intensity data and calculating the second intensity data which correspond to the first unit area.

9. The method of claim 8, wherein calculating the first corrected intensity data includes averaging the first intensity data and the second intensity data which correspond to the first unit area.

10. The method of claim 7, wherein a width of the first overlapping area is substantially equal to a width of the first unit area.

11. The method of claim 1, wherein obtaining the intensity data by scanning the target substrate further includes obtaining third intensity data by scanning a third scan area which overlaps the second scan area.

12. The method of claim 11, wherein:
    the second scan area includes a first subarea defined at one side and a second subarea defined at the other side;
    the first subarea of the second scan area overlaps the first scan area; and
    the second subarea of the second scan area overlaps the third scan area.

13. The method of claim 12, wherein a width of the first subarea in the second scan area is substantially equal to a width of the second subarea of the second scan area.

14. The method of claim 12, wherein:
    the first subarea of the second scan area overlaps the first scan area in a first overlapping area defined; and
    the second subarea of the second scan area overlaps the third scan area in a second overlapping area.

15. The method of claim 14, wherein setting the plurality of unit areas includes:
    setting a first unit area in the first overlapping area; and
    setting a second unit area in the second overlapping area.

16. The method of claim 15, wherein a width of the first unit area is substantially equal to a width of the first overlapping area.

17. The method of claim 15, wherein a width of the first overlapping area is substantially equal to a width of the second overlapping area.

18. The method of claim 15, wherein calculating the corrected intensity data includes:
    calculating first corrected intensity data by extracting the first intensity data and the second intensity data which correspond to the first unit area; and
    calculating second corrected intensity data by extracting the second intensity data and the third intensity data which correspond to the second unit area.

19. The method of claim 18, wherein:
    the calculating of the first corrected intensity data includes averaging the first intensity data and the second intensity data which correspond to the first unit area; and
    the calculating of the second corrected intensity data includes averaging the second intensity data and the third intensity data which correspond to the second unit area.

20. The method of claim 19, further comprising:
    calculating critical dimension data of the photoresist patterns of the first unit area and the second unit area from the first corrected intensity data and the second corrected intensity data; and
    generating a critical dimension change map of the photoresist patterns of the target substrate by aggregating the critical dimension data of the first unit area and the second unit area.

21. A system for measuring a critical dimension, the system comprising a controller configured to control an apparatus to:

identify a first scan area of a target substrate and a second scan area of the target substrate overlapping the first scan area;

emit first light onto the first scan area and second light onto the second scan area;

measure intensity of the first light reflected from the first scan area and of the second light reflected from the second scan area;

obtain first intensity data for a unit area overlapping the first scan area based on the first light, and second intensity data for the unit area based on the second light;

calculate corrected intensity data for the unit area based on the first intensity data and the second intensity data; and calculate critical dimension data of photoresist patterns of the unit area based on the corrected intensity data.

22. The system of claim 21, wherein a width of the first scan area, a width of the second scan area, and a width of the unit area are equal.

* * * * *